(12) United States Patent
Tsujikawa

(10) Patent No.: US 6,525,684 B2
(45) Date of Patent: Feb. 25, 2003

(54) DIFFERENTIAL INPUT DATA SLICER

(75) Inventor: Toshiaki Tsujikawa, Tokyo (JP)

(73) Assignee: Nippon Precision Circuits Inc., Tokyo (JP)

( * ) Notice: Subject to any disclaimer, the term of this patent is extended or adjusted under 35 U.S.C. 154(b) by 0 days.

(21) Appl. No.: 09/975,576

(22) Filed: Oct. 11, 2001

(65) Prior Publication Data

US 2002/0070765 A1 Jun. 13, 2002

(30) Foreign Application Priority Data

Nov. 2, 2000 (JP) ........................................ 2000-335923

(51) Int. Cl.[7] .............................. H03M 1/12; H03L 7/06
(52) U.S. Cl. ....................................... 341/155; 327/157
(58) Field of Search ................................ 341/155, 136; 327/157, 66, 58; 330/297; 375/244, 376, 261; 348/21, 465

(56) References Cited

U.S. PATENT DOCUMENTS 5,974,088 A * 10/1999 Chang ........................ 375/244
6,011,440 A * 1/2000 Bell et al. ................... 330/297
6,140,853 A * 10/2000 Lo .............................. 327/157

* cited by examiner

Primary Examiner—Patrick Wamsley
(74) Attorney, Agent, or Firm—Jordan & Hamburg LLP

(57) ABSTRACT

Automatic slice level control response to differential input signals is provided to remove in-phase noise and effects on S/N ratio Analog differential input signals Vinp and Vinn are inverted with respect to each other and applied to input terminals in1 and in2 of a comparator via resistors R1 and R2. A data stream is provided giving DSV=0. A charge pump is driven by a digital signal from the comparator. A transconductance amplifier produces output current Itrc1 and Itrc2 that are mutually differential signals and in proportion to the voltage difference between the output voltage Vcp from the charge pump and a reference voltage Vref. The output currents are supplied to the input terminals in1 and in2 of the comparator to provide a DSV=0. The analog differential input signals are binarized by the comparator to remove in-phase noise

19 Claims, 6 Drawing Sheets

DIFFERENTIAL INPUT DATA SLICER

BACKGROUND OF THE INVENTION

1. Field of the Invention

The present invention relates to a data slicer circuit and, more particularly, to a data slicer circuit for binarizing analog signals, which are obtained by reading a recording medium such as a CD (compact disc) or DVD (digital versatile disc) with a pickup, in accordance with a DSV (digital sum value) and demodulating the data into digital data.

2. Description of the Related Art

Today, data streams are recorded on recording media such as CDs and DVDs while giving DSV (digital sum value)=0. In particular, in a data stream consisting of an array of 1's and 0's, the difference between the number of 1's and the number of 0's is set to 0 in a certain number of bits of data. During readout, an analog signal read out by a pickup system is compared with a slice level and binarized by a comparator and thus the signal is demodulated into a data stream that is a digital signal. The slice level is so controlled that the DSV=0 holds in the data stream produced from the comparator. Thus, accurate readout is accomplished.

A specific conventional data slicer circuit responds to a single input signal as shown in FIG. 6. After binarization, digital signal processing has been used for error detection DSV≠0. An analog signal, having undergone single end conversion, is input to a terminal input, and is sent to a comparator 61. Data binarized by the comparator 61 is sent to a pulse width detection circuit 62, where the data is arithmetically processed. An arithmetic processing circuit 63 finds the amount of deviation from a duty ratio of 50% using the pulse width detected by the pulse width detection circuit 62. The amount of deviation is pulse width-modulated by a pulse width modulation circuit 64. The pulse width-modulated, binarized signal is averaged by a low-pass filter formed by a capacitor C1 and a resistor R1 to produce a pulse width-modulated average signal. A reference signal 65 is also averaged by a low-pass filter formed by a capacitor C2 and a resistor R2. The difference from the pulse width-modulated average signal is calculated by an analog difference calculation circuit 66. The result of the calculation, or difference, produces a slice level signal for the comparator 61. The binarized output from the comparator 61, i.e., a digital signal, responds to satisfy DSV=0. The loop frequency of this circuit is determined~by the two resistors R1, R2 and the two capacitors C1, C2.

Normally, in an analog signal processing circuit used for a pickup system for magnetic discs, optical discs, or the like, an equalizer circuit for waveform equalization is built from a differential circuit, for the following reason. Signals to be processed are taken as differential signals and subjected to subtractive operation by a differential circuit to remove noise mainly coming from the power line, i.e., to remove so-called in-phase noise. In the conventional data slicer circuit shown in FIG. 6, however, the output signal from the equalizer circuit needs to be converted into a single signal by analog signal processing because of single input processing. An analog signal that is a single signal created by the equalizer circuit (not shown) for waveform equalization is fed to the terminal Input.

In the conventional structure shown in FIG. 6, a single signal is input, and the slice level is controlled in response to this single signal. It has been impossible to provide automatic slice level control in response to a differential input signal. The single signal processing is subject to in-phase noise. As a result, the slice level varies. Hence, ideal DSV=0 cannot be accomplished. Therefore, there is the problem that the S/N ratio is deteriorated.

Furthermore, in the conventional structure shown in FIG. 6, digital signal processing is performed to control the slice level after binarization. This presents the problem that the circuit scale is increased. Additionally, the processing operation speed is limited by the operating clock.

SUMMARY OF THE INVENTION

Accordingly, it is an object of the present invention to enable automatic slice level control in response to differential input signals, to remove in-phase noise by transferring analog signals differentially to thereby alleviate the effect on S/N ratio, to accomplish ideal and desired DSV (e.g., DSV=0), to reduce the circuit scale, and to improve processing speed.

A data slicer circuit in accordance with the present invention comprises: a comparator having first and second input terminals for receiving, via their respective first and second resistors, first and second analog signals which are mutually differential signals based on data to which a given DSV(digital sum value) is given, the comparator comparing input voltages from the first and second input terminals and producing a two-valued digital output signal; a charge pump driven by the digital output signal produced from the comparator; and a trans conductance amplifier for applying first and second output currents, which are mutually differential signals in proportion to the difference voltage between the output voltage from the charge pump and a reference voltage, to the first and second input terminals, respectively, of the comparator. The digital signal is so controlled that the given DSV is attained.

Preferably, the output voltage from the charge pump is fed to the trans conductance amplifier via a low-pass filter.

The above-described charge pump preferably comprises plural first current sources for charging capacitors and plural second current sources for discharging the capacitors. When the capacitors are charged and discharged, the first and second current sources are selectively used to switch the loop frequency of a loop formed by the comparator, the charge pump, and transconductance amplifier.

The aforementioned charge pump preferably can perform charging and discharging operations using plural capacitors selectively. The loop frequency of a loop formed by the comparator, the charge pump, and the transconductance amplifier is switched.

DESCRIPTION OF THE PREFERRED EMBODIMENTS

A data slicer circuit in accordance with the present invention is next described in detail in connection with a first embodiment illustrated in FIG. 1. A comparator 1 consists of a differential amplifier and has input terminals in1 and in2 to which mutually inverted analog signals Vinp and Vinn are applied via resistors R1 and R2. The analog differential input signals Vinp and Vinn are analog differential signals obtained by reading an optical disc on which data is recorded by giving DSV (digital sum value)=0 with a pickup system (not shown). For example, it is obtained by subjecting the output current from a photodiode in an optical pickup to current-to-voltage conversion, creating a differential signal by a fully differential amplifier or the like, and then correcting peak shift or the like accompanying RF reading by an equalizer for waveform equalization. The resistors R1 and R2 act to shift the DC voltage levels of the analog differential input signals Vinp and Vinn using the output currents Itrc1 and Itrc2 from a transconductance amplifier (described later). Let Vcomp1 and Vcomp2 be input voltages to the comparator 1. Let Vinp (DC) and Vinn (DC) be the DC voltage levels of the analog differential input signals Vinp and Vinn. Thus, we have $$\begin{pmatrix} Vcomp1 = Vinp(DC) + R1 \cdot Intrc1 \\ Vcomp2 = Vinp(DC) + R1 \cdot Intrc2 \end{pmatrix} \quad (1)$$

The values of the resistors R1 and R2 or the values of the output currents Itrc1 and Itrc2 are so determined as to cancel out the input offsets of the analog differential input signals Vinp and Vinn. That is, these resistance values and current values are determined in such a way that the DC offset voltage components of the applied signals are canceled out, and a slice level control operation (described later) is enabled.

When the input voltage Vcomp1 is higher than the input voltage Vcomp2, the comparator 1 sets the logic level of the output voltage Vdata from the output terminal out1 to high ("1"). If the former voltage is lower than the latter voltage, the comparator sets the logic level to low ("0"). Thus, the comparator binarizes the analog differential input signals Vinp and Vinn and demodulates them into digital signals. These digital signals are used in a circuit at a later stage as digital signals read from a recording medium such as an optical disc and sent to the charge pump 2.

Figure 2:
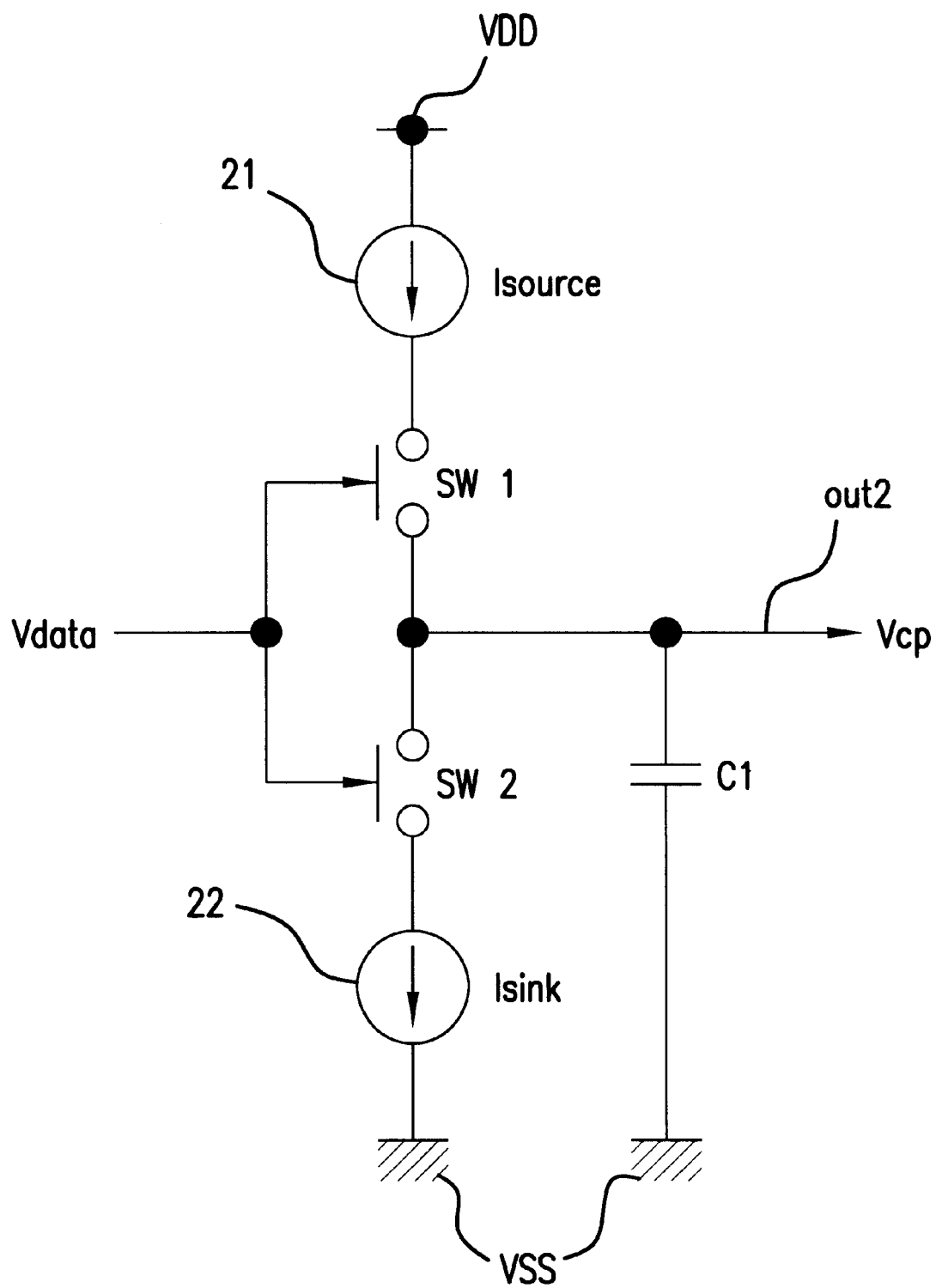
FIG. 2 is a block diagram showing the details of the charge pump of FIG. 1.

As shown in FIG. 2, the charge pump 2 has a first current source 21, switches SW1, SW2, and a second current source 22 connected in series between power-supply terminals VDD (3V) and VSS (0 V). The junction of the switches SW1 and SW2 is taken as an output terminal out. A capacitor C1 is connected between an output terminal out2 and the power-supply terminal VSS. When the logic level of the output voltage Vdata is low, the switch SW1 is turned on. Current Isource from the first current source 21 flows, charging the capacitor C1. This increases the output voltage Vcp from the output terminal out 2. When the logic level of the output voltage Vdata is high, the switch SW2 is turned on. Current Isink flows from the capacitor C1 to the second current source 22, thus discharging the capacitor C1. This lowers the output voltage Vcpfrom the output terminal out2. Normally, the current values are determined such that |Isource|=|Isink|. Let ΔTon be the period during which Vdata is kept high. Let ΔToff be the period during which Vdata is kept low. The output voltage from the charge pump 2 can be given by $$Vcp = \frac{1}{C1}(\Delta Toff \cdot Isource - \Delta Ton \cdot Isink) \quad (2)$$

That is, the charge pump 2 delivers an output voltage Vcp corresponding to DSV of 1's and 0's of the digital signal from the output terminal out1.

The trans conductance amplifier 3 compares the output voltage Vcp from the charge pump 2 with a reference voltage Vref and produces an output that is the current difference between output currents Itrc1 and Itrc2 that is proportional to the voltage difference. Let Vcp be the value of the output voltage Vcp. Let Vref be the value of the reference voltage Vref. Let Itrc1 be the values of the output currents Itrc1 and Itrc2 be the values of the output currents Itrc2, respectively. The trans conductance amplifier 3 produces Itrc1=Itrc2 when Vref=Vcp. It produces Itrc1>Itrc2 when Vref<Vcp. It produces Itrc1<Itrc2 when Vref>Vcp.

Figure 1:
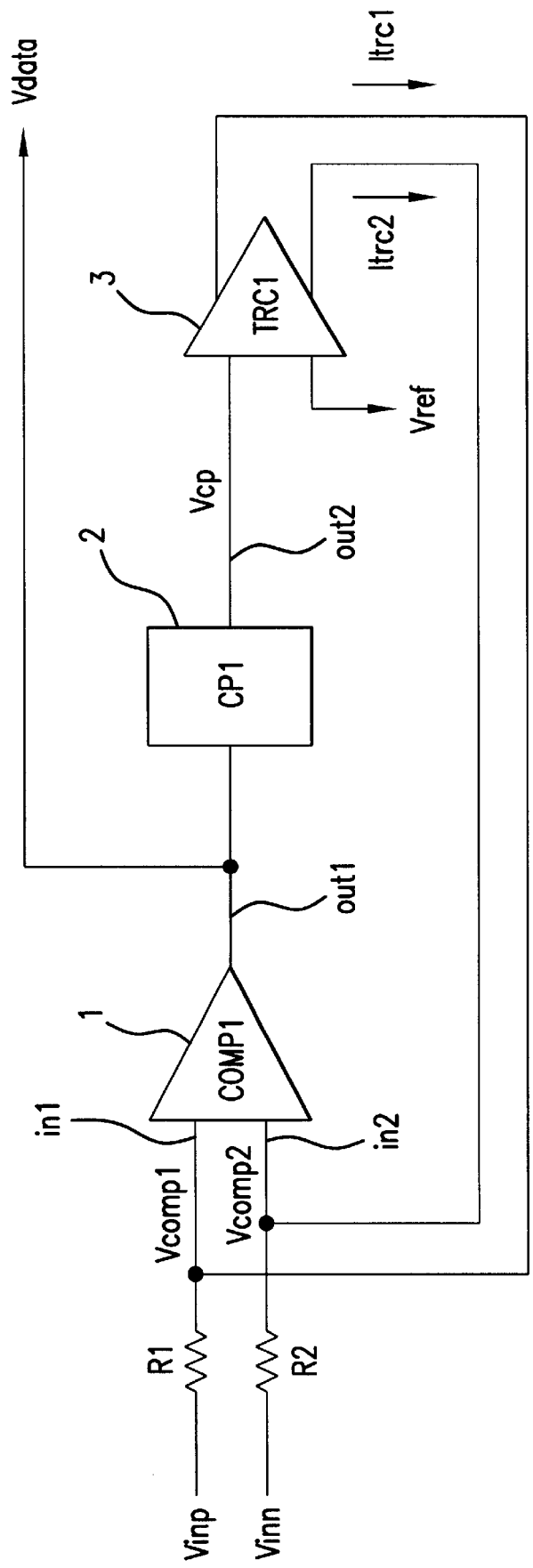
FIG. 1 is a block diagram showing the configuration of a data slicer circuit in accordance with a first embodiment of the present invention.

The loop response frequency of FIG. 1 is determined by the capacitance value of the capacitor C1 and the current values Isink and Isource. The loop frequency is set sufficiently lower than the input signal frequency. Its interval is made to correspond to an integral multiple of the interval at which the numbers of 1's and 0's giving DSV=0 in the data stream stored on the aforementioned recording medium such as an optical disc are read out. In other words, the loop frequency is made to correspond to the frequency of the analog differential input signal. That is, it is determined so as to correspond to the rate at which the recording medium is read.

The operation of the present invention is next described.

The analog differential input signals Vinp and Vinn are applied to the comparator 1 via the resistors R1 and R2, respectively. Thus, the signals are binarized and sent as the digital signal of output voltage Vdata to the charge pump 2. The charge pump 2 charges and discharges the capacitor C1 according to whether the output voltage Vdata is high or low. As mentioned above, the relation |Isource|=|Isink| has been set and, therefore, it can be seen from Eq. (2) that the output voltage Vcp from the charge pump 2 is in proportion to the difference between the period ΔTon of the high level and the period ΔToff of the low level, and corresponds to the DSV of 1's and 0's of the digital signal from the output terminal out1.

The transconductance amplifier 3 compares the output voltage Vcp and the reference voltage Vref and makes a current difference between the output currents Itrc1 and Itrc2 proportional to the voltage difference. When DSV=0, the output voltage Vcp corresponds with the reference voltage Vref (ideally, 0 V). Where Vref<Vcp, i.e., the digital signal from the output terminal out1 contains more 0's, the current Itrc1 is made greater than the current Itrc2 by an amount corresponding to the difference between the output voltage Vcp and the reference voltage Vref. Thus, R1·Itrc1, that is the DC voltage level shift component of the voltage Vcomp1 indicated by Eq. (1), is made larger than the DC voltage level shift component of the voltage Vcomp2 by R2·Itrc2. In this way, an effect equivalent to decreasing the slice level in the related art single-signal input data slicer circuit is obtained. Conversely, where Vref>Vcp, i.e., the digital signal from the out terminal output1 contains more 1's, the current Itrc1 is made lower than the current Itrc2 by an amount corresponding to the voltage difference between the output voltage Vcp and the reference voltage Vref. In this manner, R1·Itrc1 that is the DC voltage level shift component of the voltage Vcomp1 indicated by Eq. (1) is made lower than R2 Itrc2 that is the DC voltage level shift component of the voltage Vcomp2. As a result, an effect equivalent to increasing the slice level of the data slicer circuit of the related art single-signal input method is obtained. Because of the operations described thus far, the output voltage Vcp is controlled to correspond with the reference voltage Vref. The digital signal from the output terminal out1 accomplishes DSV=0.

In the present example, the effects of in-phase noise can be suppressed by binarizing the analog differential input signals using the comparator 1 consisting of a differential amplifier. Also, the effects of in-phase noise are suppressed by building the trans conductance amplifier 3 as a differential configuration. In-phase noise tends to be introduced in the output voltage Vcp that is converted into a single signal. However, the effects of noise can be neglected by setting the frequency band of the output voltage Vcp sufficiently lower than the input signal frequency. Therefore, the slice level can be controlled without being affected by in-phase noise. Thus, ideal DSV=0 can be accomplished.

As described thus far, in the present embodiment, the slice level control responsive to the differential input signals can be automatically provided. The analog signals are transferred differentially to thereby remove in-phase noise. The effects on S/N ratio due to in-phase noise are alleviated. Thus, ideal DSV=0 is accomplished. The automatic slice level control is not digital signal processing but analog signal processing. The circuit components that are necessary in addition to the comparator 1 are only simple components including the charge pump 2 and the trans conductance amplifier 3. Hence, the circuit scale can be reduced. In addition, the operating speed can be improved because of the analog signal processing, compared with digital signal processing where the processing speed is limited by the operating clock.

A second embodiment of the present invention is next described.

Figure 3:
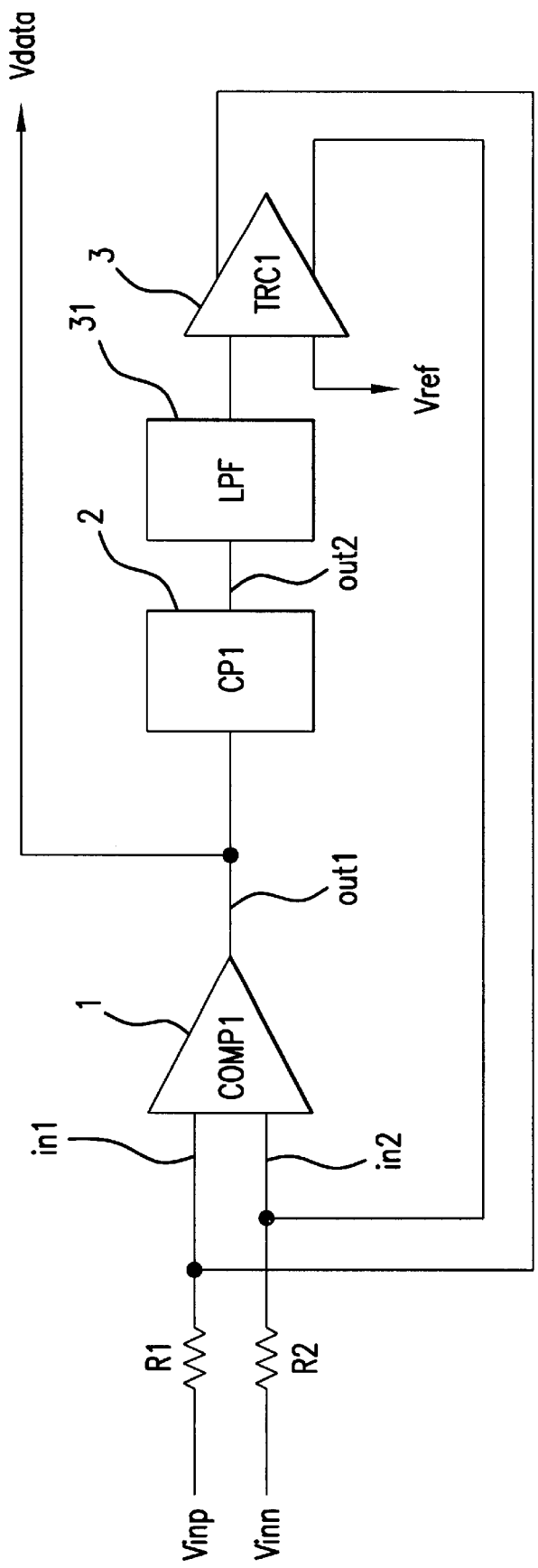
FIG. 3 is a block diagram showing the configuration of a data slicer circuit in accordance with a second embodiment of the invention.

It is conceivable that a low-pass filter is connected as a method of reducing the effects of noise further. For example, as shown in FIG. 3, a low-pass filter 31 is connected between the charge pump 2 and a transconductance amplifier 31, thus reducing noise introduced in the output voltage Vcp and the amount of voltage ripple contained in the output voltage Vcp due to switching of the charge pump.

A third example of the present invention is next described.

In the embodiments described above, the loop frequency is fixed within one system.

Figure 4:
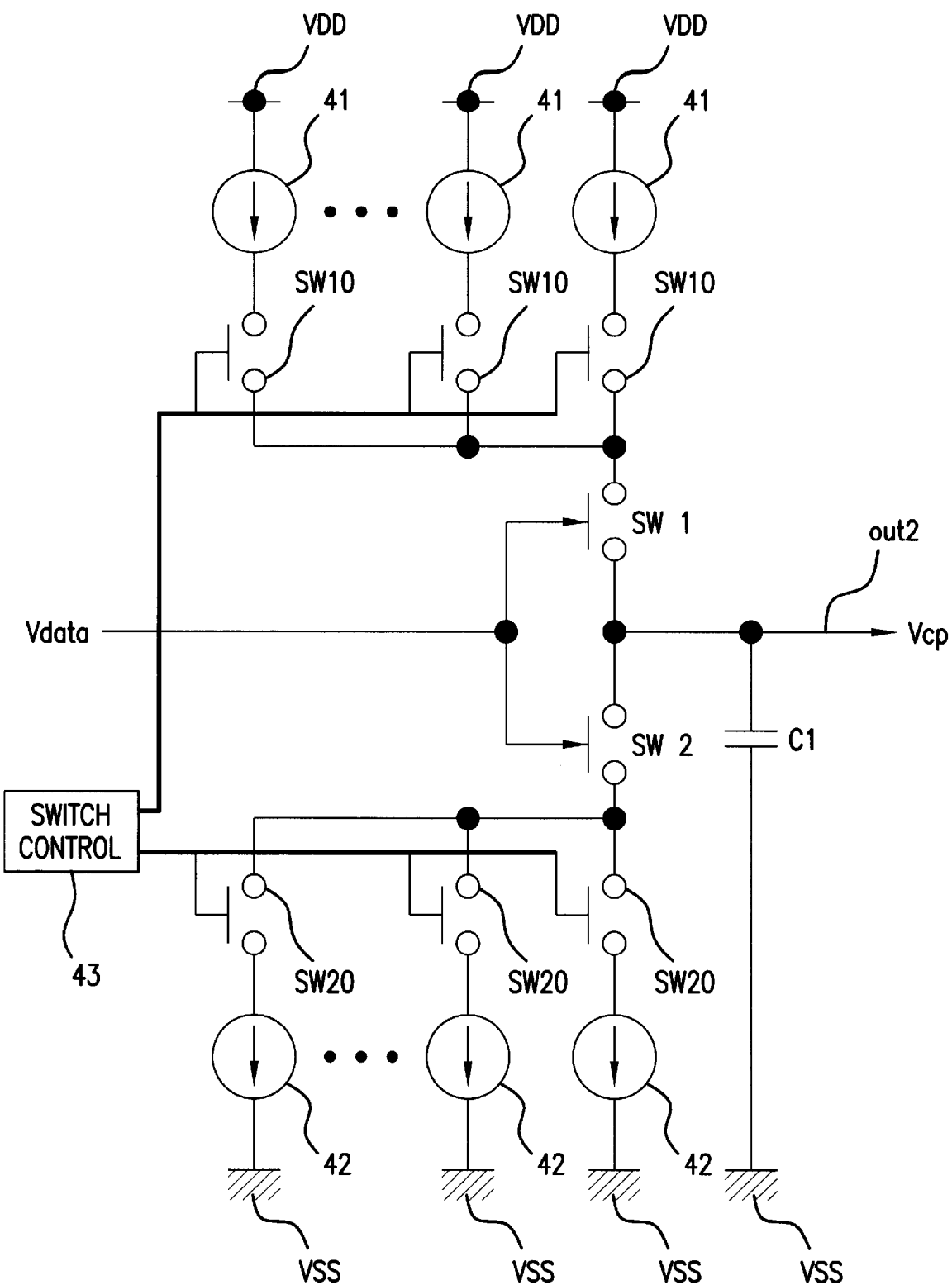
FIG. 4 is a block diagram showing the configuration of a charge pump in a data slicer circuit in accordance with a third embodiment of the invention.
Figure 5:
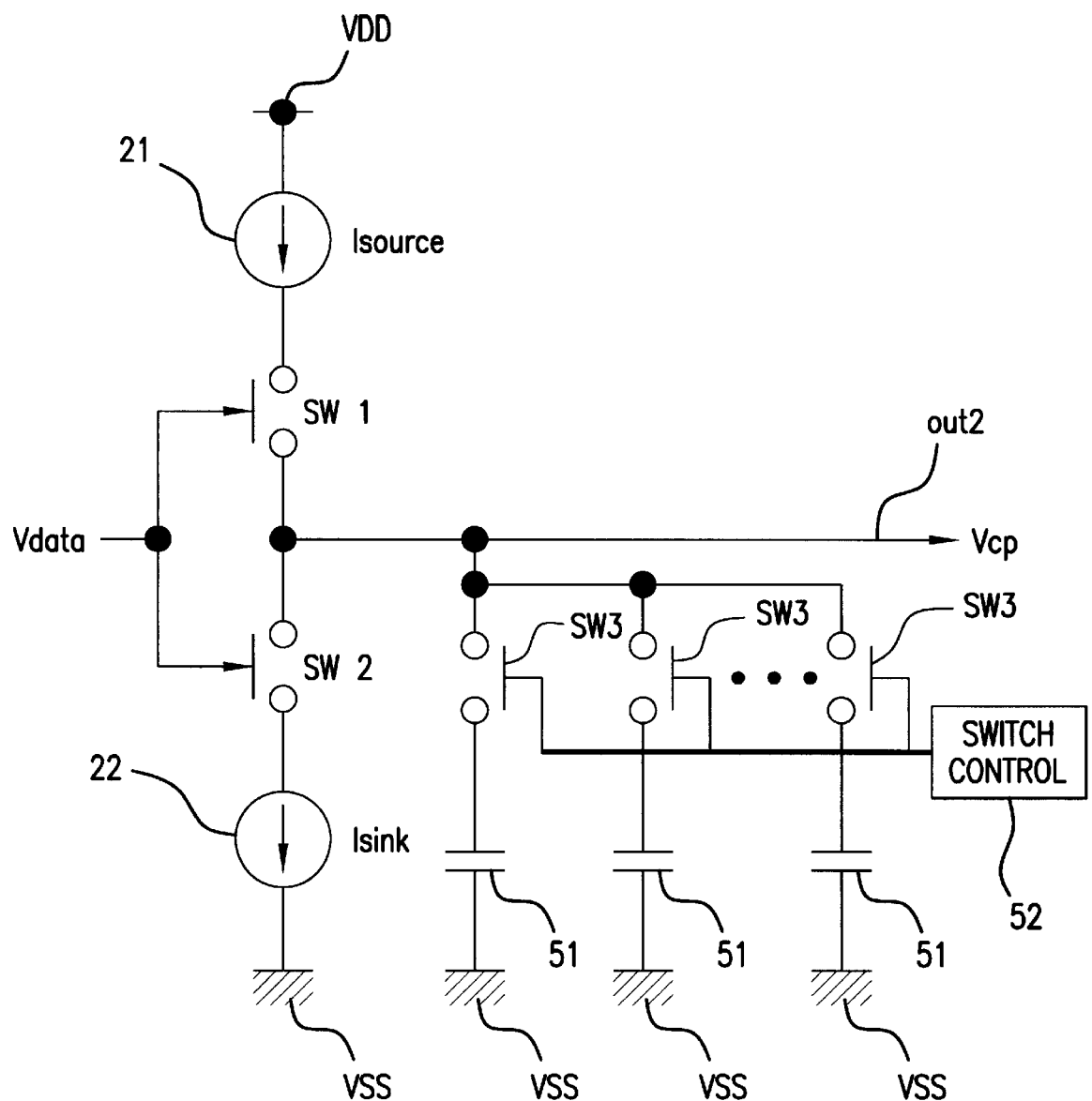
FIG. 5 is a block diagram showing another configuration of a charge pump in the data slicer circuit in accordance with the third embodiment of the invention.
Figure 6:
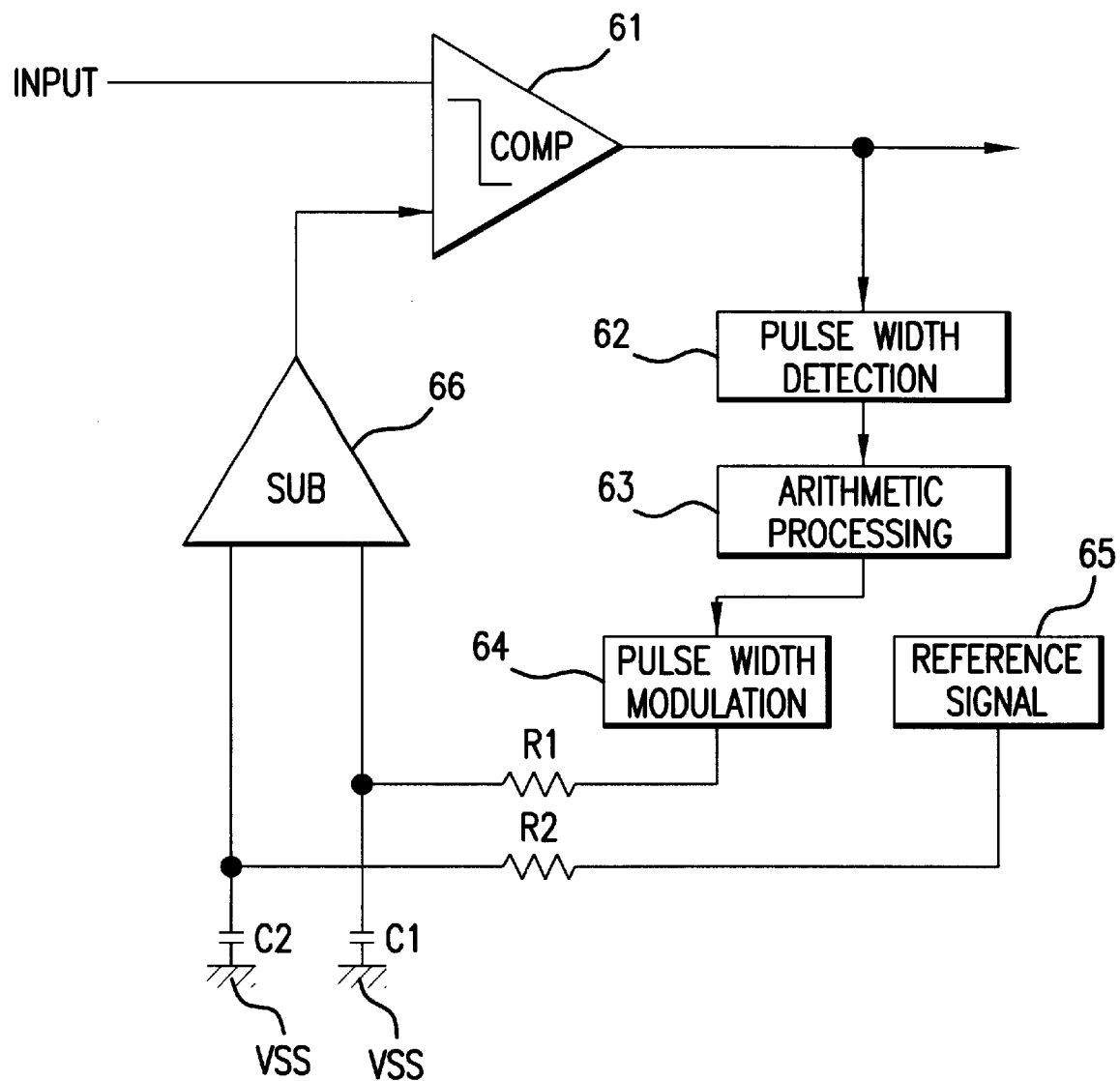
FIG. 6 is a block diagram showing the configuration of the related art data slicer circuit.

The present invention is not limited to this. The frequency may be variable. This variable case is permitted by switching the current value through the charge pump or switching the capacitance value. Where the current value is switched, the charge pump is designed as shown in FIG. 4. That is, plural current sources 41 connected to power-supply terminal VDD are connected to a switch SW1 via switches SW10, and plural current sources 42 connected to a power-supply terminal VSS are connected to a switch SW2 via switches SW20. The switches SW10 and SW20 are selectively turned on by a switch control circuit 43, thus switching the current value. The current value can be increased, thus elevating the loop frequency. The current value can be reduced, thus lowering the loop frequency. Where the capacitance value is switched, the charge pump is designed as shown in FIG. 5. That is, capacitors 51 have their respective one terminal connected to the power-supply terminals VSS. The other terminals are connected to the output terminal out2 via switches SW3, respectively. The switches SW3 are selectively turned on by a switch control circuit 52, thus switching the capacitance value. The loop frequency is lowered by increasing the capacitance value. The loop frequency is elevated by reducing the capacitance value. In this way, it is possible to cope with plural analog differential input signals of different frequencies. That is, it is possible to cope with analog signals read from a recording medium at plural different frequencies or with analog signals transmitted at plural different frequencies.

In the embodiments described above, the data slicer circuit produces digital signals by binarizing analog differential input signals that are obtained by reading a recording medium (e.g., an optical disc) on which a certain bits of data are recorded under the condition DSV=0. The present invention is not restricted to this. The invention is also applicable to a circuit where the DSV of a certain bits of data has a given value. In this case, the reference voltage Vref for the transconductance amplifier 3 may be set to the output voltage Vcp corresponding to ΔTon and ΔToff determined according to the value of the DSV.

In the present invention, analog differential input signals, which are inverted with respect to each other and obtained by reading a recording medium, are applied to a comparator 1 via resistors R1 and R2. A data stream is recorded on the recording medium while giving DSV=0, for example. A charge pump 2 is driven according to a digital signal produced from the comparator 1. A transconductance amplifier 3 produces output currents that are mutually differential signals and in proportion to the voltage difference between the output voltage from the charge pump 2 and a reference voltage $V_{ref}$. The output currents are supplied to the input terminals of the comparator 1. Therefore, the slice level can be controlled by shifting the DC voltage level of the analog differential input signals by the output currents and the resistors R1 and R2. The digital signal produced from this comparator 1 accomplishes given DSV (e.g., DSV=0). As a result, the slice level can be controlled in response to the analog differential input signals. The effects of in-phase noise coming from the power supply and so on are reduced by binarizing the analog differential input signals by the comparator 1. The reliability of the digital signal obtained by the binarization is enhanced. If a low-pass filter 31 is mounted between the charge pump 2 and the trans conductance amplifier 3, the amount of voltage ripple due to switching of the charge pump 2 can be reduced. The adverse effect of the voltage ripple can be reduced. More accurate desired DSV (e.g., DSV=0) can be accomplished.

As described thus far, the data slicer circuit in accordance with the present invention is functionally simple but can accomplish desired DSV with high precision (e.g., DSV=0) almost immune to in-phase noise by an analog signal processing, using the charge pump 2 and the transconductance amplifier 3. Since no digital signal processing is used for the slice level control, the circuit scale can be reduced. Furthermore, the operating speed can be improved because analog signal processing is faster compared with digital signal processing where the processing speed is limited by the operating clock.

The charge pump 2 is equipped with plural first current sources 41 for charging capacitors and with plural second current sources 42 for discharging the capacitors. It is possible to cope with analog differential input signals of plural frequencies by switching the loop frequency of the loop formed by comparator 1, charge pump 2, and transconductance amplifier 3 by selectively using the first and second current sources 41 and 42 when the capacitors are charged and discharged. Alternatively, the charge pump 2 can perform charging and discharging operations by selectively using plural capacitors 51. In other words, it is possible to cope with analog signals read from a recording medium on which data is recorded at plural different frequencies or with analog signals transmitted at plural different frequencies.

What is claimed is:

1. An analog data slicer circuit for slicing a differential input signal formed of first and second analog signals, comprising:

a differential comparator having first and second input terminals for receiving respectively, via respective resistors, said first and second analog signals that are mutually differential signals based on data to which a given DSV (digital sum value) is given, said comparator comparing input voltages applied to said first and second input terminals and producing a two-valued digital output signal;

a charge pump driven by said digital output signal from said differential comparator;

a transconductance amplifier for supplying first and second output currents to said first and second input terminals, respectively, of said comparator, said first and second output currents being mutually differential signals proportional to a difference voltage between an output voltage from said charge pump and a reference voltage; and wherein said digital signal is controlled to achieve said given DSV.

2. The analog data slicer circuit of claim 1, wherein the output voltage from said charge pump is applied to said transconductance amplifier via a low-pass filter.

3. The analog data slicer circuit of claim 1 or 2, wherein said charge pump is equipped with plural first current sources for charging capacitors and with plural second current sources for discharging said capacitors, and wherein the loop frequency of a loop formed by said comparator, said charge pump, and said transconductance amplifier is switched by selectively using said first and second current sources when said capacitors are charged and discharged.

4. The analog data slicer circuit of claim 1 or 2, wherein said charge pump can charge and discharge plural capacitors and switches the loop frequency of a loop formed by said comparator, said charge pump, and said transconductance amplifier.

5. An analog data slicer for accepting a differential input signal including first and second analog input signals, comprising:

a differential comparator having first and second differential signal inputs respectively receiving said first and second analog input signals, and producing a comparator output signal based on said first and second analog input signals;

a charge pump driven by said comparator output signal and producing a charge pump output signal; and a transconductance amplifier accepting said charge pump output signal as a signal input and providing first and second differential output signals respectively applied to said first and second differential signal inputs.

6. The analog data slicer according to claim 5, wherein the charge pump includes current sourcing/sinking circuitry for varying charging and discharging current to vary a loop frequency.

7. The analog data slicer according to claim 6, wherein said current sourcing/sinking circuitry includes plural current sources and plural current sinks selectively applied.

8. The analog data slicer according to claim 7, wherein the charge pump includes capacitive circuitry for varying charging capacity to vary a loop frequency.

9. The analog data slicer according to claim 8, wherein said capacitive circuitry includes plural capacitors selectively applied.

10. The analog data slicer according to claim 6, wherein the charge pump includes capacitive circuitry for varying charging capacity to vary a loop frequency.

11. The analog data slicer according to claim 10, wherein said capacitive circuitry includes plural capacitors selectively applied.

12. The analog data slicer according to claim 5, further comprising first and second resistance respectively applying said first and second analog input signals to said first and second differential signal inputs.

13. The analog data slicer according to claim 12, wherein the transconductance amplifier has a reference voltage applied to another signal input.

14. The analog data slicer according to claim 13, further comprising a low pass filter applying said charge pump output to said transconductance amplifier.

15. The analog data slicer according to claim 5, wherein the transconductance amplifier has a reference voltage applied to another signal input.

16. The analog data slicer according to claim 15, further comprising a low pass filter applying said charge pump output to said transconductance amplifier.

17. The analog data slicer according to claim 5, wherein the charge pump including capacitive circuitry for varying charging capacity to vary a loop frequency.

18. The analog data slicer according to claim 17, wherein said capacitive circuitry includes plural capacitors selectively applied.

19. The analog data slicer according to claim 5, further comprising a low pass filter applying said charge pump output to said transconductance amplifier.

* * * * *